United States Patent
Adams et al.

(10) Patent No.: US 7,071,740 B2
(45) Date of Patent: Jul. 4, 2006

(54) CURRENT LIMITING CIRCUIT FOR HIGH-SPEED LOW-SIDE DRIVER OUTPUTS

(75) Inventors: Reed W. Adams, Plano, TX (US); Thomas A. Schmidt, Murphy, TX (US); Suribhotla V. Rajasekhar, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 78 days.

(21) Appl. No.: 10/951,969

(22) Filed: Sep. 28, 2004

(65) Prior Publication Data
US 2005/0140425 A1   Jun. 30, 2005

Related U.S. Application Data

(60) Provisional application No. 60/533,152, filed on Dec. 30, 2003.

(51) Int. Cl.
*H03B 1/00* (2006.01)
(52) U.S. Cl. .................. 327/110; 327/389; 327/427
(58) Field of Classification Search ........... 323/225, 323/271, 289; 327/108, 109, 110, 111, 372, 327/387, 388, 389, 427
See application file for complete search history.

(56) References Cited

U.S. PATENT DOCUMENTS

| | | | |
|---|---|---|---|
| 5,796,278 A * | 8/1998 | Osborn et al. ............... 327/108 |
| 5,936,387 A * | 8/1999 | Tabata et al. ................ 323/225 |
| 6,333,665 B1 * | 12/2001 | Ichikawa ..................... 327/434 |

* cited by examiner

*Primary Examiner*—Jeffrey Zweizig
(74) *Attorney, Agent, or Firm*—William B Kempler; W. James Brady, III; Frederick J. Telecky, Jr.

(57) ABSTRACT

A FET switching transistor for the solenoid coil of an ABS braking system can switched ON or OFF in no more than substantially 250 ns. A higher current biasing circuit for fast turn on of the FET switching transistor is disconnected when it is necessary to limit the current flowing therethrough, whether during the inrush current to the solenoid coil or due to a fault in the system. The high speed switching of the FET switching transistor causes ringing of the current through the transistor which causes the current detector circuit to exit the current control mode. A deglitch circuit prevents the current detector from exiting the current control mode, so that a timer can be used to turn off the FET switching transistor before it can be damaged by the heat generated during current limit operation.

20 Claims, 4 Drawing Sheets

CURRENT LIMITING CIRCUIT FOR HIGH-SPEED LOW-SIDE DRIVER OUTPUTS

This application claims the benefit of U.S. Provisional Application 60/533,152, filed on Dec. 30, 2003, which application is incorporated herein by reference.

TECHNICAL FIELD OF THE INVENTION

The present invention relates generally to a current limit circuit for a switching FET transistor and more particularly to a current limiting circuit for a switching FET coupled to a control solenoid of a ABS braking system for an automobile.

BACKGROUND OF THE INVENTION

Power FETs are widely used in the automobile industry and are utilized to drive the solenoid valves in anti-lock brake systems (ABS), for example. In certain ABS braking systems, it is desirable to pulse width modulate (PWM) the signal to the solenoid in order to control the antilock function. This, in turn, requires that the turn on and turn off times of the FET switching transistor be less than 250 ns whereas turn on and turn off times of approximately 50 us were required in prior art ABS braking control systems.

In order to protect the FET from being damaged by an overcurrent condition, a current limit circuit is provided to control the maximum current allowed through the FET. In an ABS braking system, for example, it is possible for the solenoid coil to be shorted or have a fault which allows a high current to be drawn from the vehicle's battery when the FET switch is turned on. If it were not for the overcurrent protection circuit, the FET switch would be destroyed and, since the FET switch is integrated into the control integrated circuit, the entire ABS control circuit could be damaged or destroyed.

One might wonder why protection for the FET switch is important if the solenoid valve has failed, since the loss of appropriate braking power could be a catastrophic loss in the event it was necessary to make emergency stop with the vehicle or make a stop on slippery pavement, in which ABS braking systems excel. In order to avoid an incident in which the ABS braking system fails when it is needed, it is common for such systems to test the operation of the system at start up and/or while the vehicle is being driven. Thus, for example, the control system might apply a very short spike of 500 us or less, for example, to a solenoid valve in order to check the operation thereof. This would be undetectable to the driver of the vehicle. If the system detects that the solenoid valve is shorted, it would then turn on an indicator lamp on the dashboard of the vehicle to alert the driver that the ABS system was malfunctioning. The driver would then know not to rely on the ABS system and to take his vehicle for repair as soon as possible. In order to avoid damage to the integrated circuit containing the FET switching transistor, it is necessary to have a current limit function, which will protect the device during these tests as well as during the actual operation of the braking system.

SUMMARY OF THE INVENTION

It is a general object of the present invention to provide an improved current limit circuit for an FET switching transistor.

This and other objects and features are provided, in accordance with one aspect of the invention, by an FET switch having a current limit circuit comprising an FET switching transistor. A current detector is coupled to the FET switching transistor for measuring the current through the FET switching transistor. A first biasing circuit is coupled to the gate of the FET switching transistor providing a first biasing current to the gate. A second biasing current is coupled to the gate of the FET switching transistor providing a second biasing current to the gate, the second biasing current being less than the first biasing current. A biasing switching circuit is coupled to the first biasing circuit to disconnect the flow of the first biasing current when an overcurrent condition is detected by the current detector, whereby the current detector can limit the FET switching transistor current.

Another aspect of the invention includes in an ABS braking system, an FET switch for PWM the voltage across a control solenoid comprising an FET switching transistor having a conductive path coupled to the solenoid at a node. A current detector is coupled to a FET switching transistor for measuring a current therethrough, the current detector generating a current control signal in response to current through the FET switching transistor which exceeds a predetermined level. A first biasing current source is coupled to the gate, the first biasing current source enabling the FET switching transistor to be turned on fast enough to generate a ringing at the node caused by the inductance of the connecting cable and the capacitance of the FET, which ringing causes the current detector to terminate the current control signal. A second biasing current source is coupled to the gate, the second current source providing a biasing current. A biasing current switching circuit is coupled to the first biasing circuit to disconnect flow of the first biasing current in response to the current control signal. A latching circuit is coupled to the current detector to prevent the current detector from terminating the current control signal as the result of the ringing.

A further aspect of the invention comprises a current limit circuit comprising a current detector coupled to a FET switching transistor for measuring current therethrough for generating a current control signal. A first switchable current source is coupled to the gate providing a first biasing current and responsive to the current control signal from the current detector. A second current source is coupled to the gate providing a second biasing current less than the first biasing current, whereby the detection of an overcurrent condition by the current detector disconnects the first biasing current to allow the current flowing through the current detector to reduce the drive on the FET switching transistor to limit the current therethrough.

DETAILED DESCRIPTION OF THE PRESENT INVENTION

Figure 1:
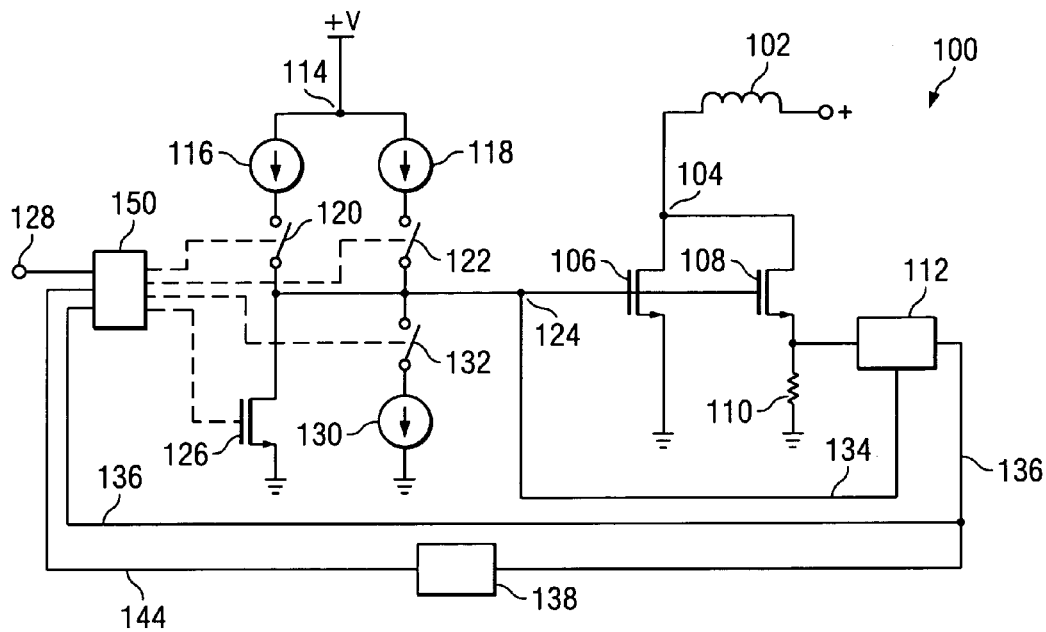
FIG. 1 is a block schematic drawing of a first embodiment of the present invention.

FIG. 1 illustrates a current limit circuit for an FET switching transistor generally as 100. The signal "FET Ctrl" is sent from a main control logic circuit to turn on and off the main output transistor 106. The load for the circuit 100 is the solenoid coil 102 of a ABS braking system, for example. Typically, these coils have an inductance of several mH. One end of the coil is connected to the positive terminal of the vehicle battery. The other end of the coil is connected to the drain of switching transistor 106 at node 104. The source of transistor 106 is connected to ground. Also connected to node 104 is the drain of a sensing transistor 108 which has its source connected to ground through resistor 110. The gates of transistor 106 and 108 are connected together to node 124. As is well known in the art, sensing transistor 108 is made much, much smaller than switching transistor 106, so that it passes a small portion of the current through transistor 106. For example, if transistor 108 were made 1,000 times smaller than transistor 106, a current of 5 amps flowing through transistor 106 would result in a current of approximately 5 miliamps flowing through transistor 108. The ratio will not be exact because the voltage drop across resistor 110 causes transistor 108 to have a Vgs which is slightly different from the Vgs of transistor 106. This sense current is converted to a voltage by resistor 110, which is measured by the detecting circuit 112. The output of the detecting circuit 112 on line 134 is connected to node 124. The output of circuit 112 on line 136 is connected to switch 120 and to timer 138. The output of timer 138 is connected to the gate of a NMOS switching transistor 126, which has its source connected to ground. The gate of this transistor is also connected to terminal 128 for receiving a signal to turn off the FET switching transistor 106 by having the drain of transistor 126 connected to node 124. Also connected to node 124 are two current sources 116 and 118. Current source 118 may be 40 microamps, for example. Current source 116 may be 20 miliamps, for example. Current source 116 is connected to node 124 via switch 120 and current source 118 is connected to node 124 via switch 122. Each of the current sources are connected to a positive supply 114. A third current source 130 is connected to node 124 via switch 132. The other terminal of the current source 130 is connected to ground. This current source may be 80 microamps, for example.

Overcurrent detector 112 also contains an amplifier so that the signal on line 134 can be used to regulate the current through FET switching transistor 106 to a predetermined level, for example, 5 A. If the FET switch 106 is allowed to remain in this current limit condition for too long a period, the heat generated by the transistor 106 will be excessive and may damage the integrated circuit. Accordingly, timer 138 is coupled to receive signal 136 and connected to terminal 128 to turn on transistor 126 after a pre-selected period of time to turn off transistor 106. This pre-selected period of time may be 200 microseconds, for example. The 200 microsecond period allows for the inrush current through inductor 102 without turning off transistor 206. Circuits 112 and 138 are known in the art, and need not be described in detail here.

In order for circuit 112 to operate to pull down the gate voltage for transistor 106, it is necessary that the high current source 116 be turned off by opening switch 120. This allows the circuit 112 to regulate against the 40 microamp current generated by current source 118 without having to fight the 20 miliamp current source 116. As configured in the circuit shown in FIG. 1, the circuit 112 would not be able to pull down the gate voltage for transistor 106 if both current sources 116 and 118 were switched on.

A logic decoder function shown as circuit 150 in FIG. 1. This circuit decodes multiple input signals in order to control the operating state of the main output FET 106, Signal 128 is the master control signal that can be sent from a microcontroller or other main logic controller (not shown). It this signal is set to logic high, the main FET 106 will be commanded on. To do this, switches 120 and 122 will be closed, and switches 126 and 132 will be opened. Note all switches are comprised of FET devices as indicated by switch 126. IN the opposite case, if signal 128 is set to logic low, switches 120 and 122 will be opened. Note all switches are comprised of FET devices as indicated by switch 126. In the opposite case, if signal 128 is set to logic low, switches 120 and 12 will be opened while switches 126 and 132 are closed. A purpose of the proposed invention is to protect against an overcurrent situation which occurs while FET 106 is on. Therefore, all other descriptions of additional signals being decoded will be described while signal 128 is at a logic high. While FET 106 is on circuit 112 can detect overcurrent and supply a control signal back to the decoder as indicated by signal 136. When signal 136 is set to logic high, circuit 150 2ill open switch 120, thus disconnecting the first current source 116 from FET 106 while leaving all other switches in their previously described state for the on condition of FET 106. Likewise, signal 144 from deglitch timer circuit 138 will cause the decoder to place FET 106 in the off state regardless of the state of the first control signal 128. This signal can also be sent back to the main logic controller so that I can detect the FET has been turned off. With this information, the main logic control and its associated software can make a decision on how to continue to drive signal 128. An example decision would be to set signal 128 to a logic low state, thus commanding FET 106 to remain in the off state even after the asserted high conditions from signals 134 and 144 disappear.

Figure 2:
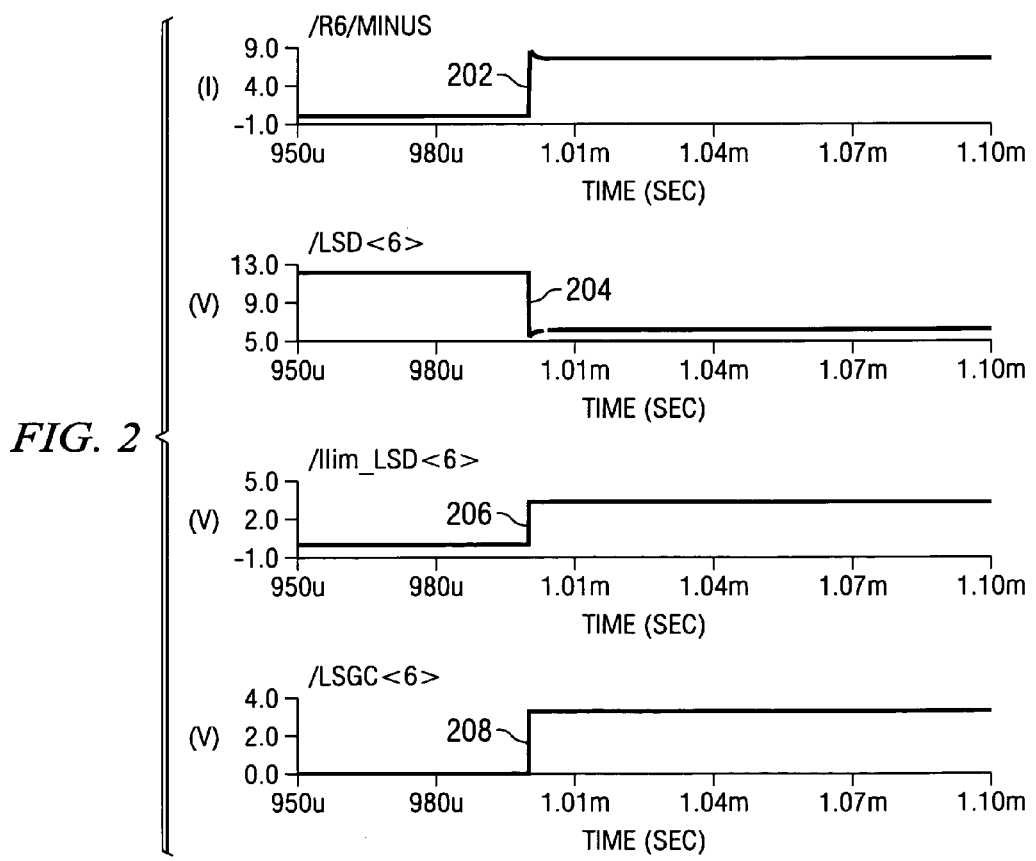
FIG. 2 is a computer simulation of the circuit shown in FIG. 1.

FIG. 2 illustrates a computer simulation of the circuit in FIG. 1. Signal 208 is the gate control voltage for FET switching transistor 106. Signal 206 is a digital feedback signal for the output from circuit 112 on line 136 that indicates transistor 106 is being current limited while signal 206 is logic high. Signal 204 shows the output voltage across switching FET transistor 106 and signal 202 shows the current through transistor 106. As can be seen from the signals shown in FIG. 2, when transistor 106 is switched on, the current limit signal 206 rises to limit the current through transistor 106 during the inrush current portion, after which the current reaches a steady state value and the voltage rises to a steady state value while the transistor is on.

Figure 3:
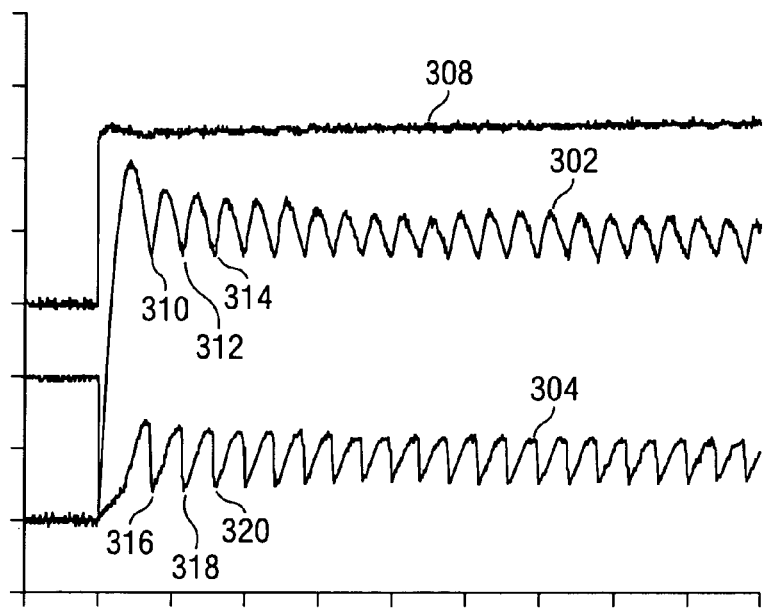
FIG. 3 shows the actual waveforms of the circuit of FIG. 1 on an oscilloscope.

However, once the device was completed, the actually measured signals for the device are depicted in FIG. 3. As can be seen in FIG. 3, when the signal 308 goes high thus turning on FET switching transistor 106, both the current through the FET shown by signal 302 and the applicable voltage across the FET shown by signal 304 show a ringing effect. The problem with the ringing effect is that at the extreme negative portions of the ringing shown at 310, 312 and 314 as well as at 316, 318, and 320 as the voltage across the FET switching transistor 106 decreases, the current therethrough falls below the current limiting threshold, and the circuit exits the current limiting function. As soon as that happens, switch 120 is closed, thus providing a high gate drive current, such as 20 miliamps for example, to the gate of switching transistor 106. This rapidly drives the gate voltage higher, increases the current through the transistor, causing the current limit circuit 112 to reactivate and the cycle to repeat. As can be seen from the curves 302 and 304 in FIG. 3, this ringing, although overamped, never gets a chance to die out, because the circuit is retriggered every time the current through the transistor falls below the current limit threshold. The period for the ringing has a cycle of about 4 to 5 microseconds long, which means that timer 138, which expires after a time period greater than 5 microseconds, is reset every 4 or 5 microseconds, and therefore can never time out to turn off the transistor 106. This can result in the transistor overheating and damage to the integrated circuit.

It is known that there is parasitic capacitances in FETs such as transistor 106, as well as in inductance and resistance in the cabling for the ABS braking system. The inventor of the present invention undertook measurements for typical cables utilized in automobile ABS braking systems and found that the inductance of the cabling was approximately 500 nH per foot or 1.5 µH per meter. A typical system will have about two meters of cabling, resulting in an inductance of approximately 3 µH. FET switching transistor 106 is a large FET transistor because of the current it must handle and its parasitic capacitance along with the 3 µH of inductance and a typical resistance of approximately 0.5 ohms produces a LRC filter, which is pinged every time the high current source 116 is connected to the circuit by closing switch 120. This causes the ringing which never allows the timer circuit to expire, resulting in damage to the integrated circuit. This effect shows up because of the fast switching times for the FET switching transistor 106; whereas, in older designs in which a slower switching speed was utilized, such effects were not seen. Normally, the typical 6 µH inductance of the ABS braking system solenoid 102 is so much greater than the 3 µH of inductance in the cable, so that the 3 µH inductance can be neglected in designing the circuit. However, because the circuit is in a state such that the current needs to be actively limited, it can be assumed that the solenoid coil typically present in the system has been shorted out, thus making the 3 µH inductance of the supply cable a significant factor during such a fault condition.

Figure 4:
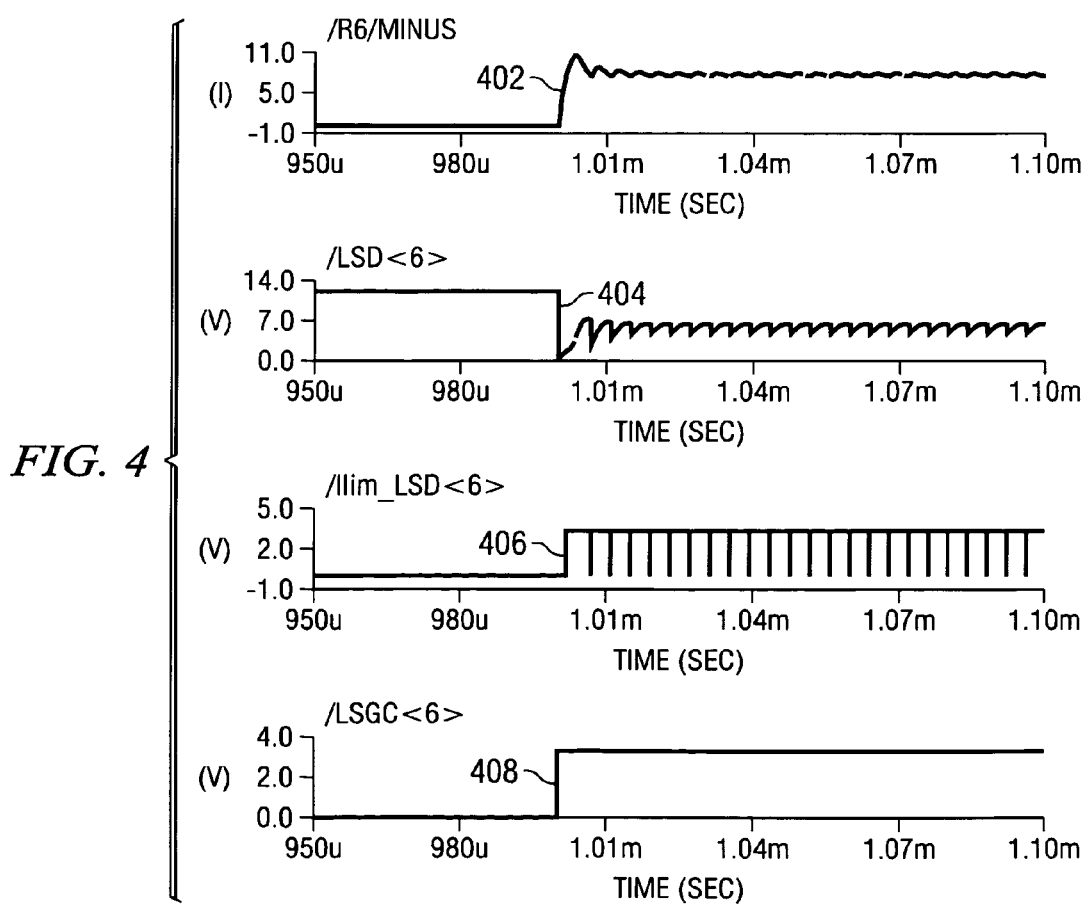
FIG. 4 is a simulation of the circuit of FIG. 1 including cable inductance.

FIG. 4 shows a computer simulation of the circuit of FIG. 1, similar to the simulation shown in FIG. 2, except that the cable resistance of 0.5 ohms and the inductance of the cable at 1.5 µH per meter, has been included. As can be seen in the simulation shown in FIG. 4, the waveforms are very similar to the waveforms shown in FIG. 3, which is the actual measured voltage across the circuit of the present invention. Accordingly, it is desirable to modify the circuit shown in FIG. 1 in order to account for this ringing effect which prevents the proper operation of the circuit shown in FIG. 1, when high speed switching of the FET switching transistor 106 is required.

Figure 5:
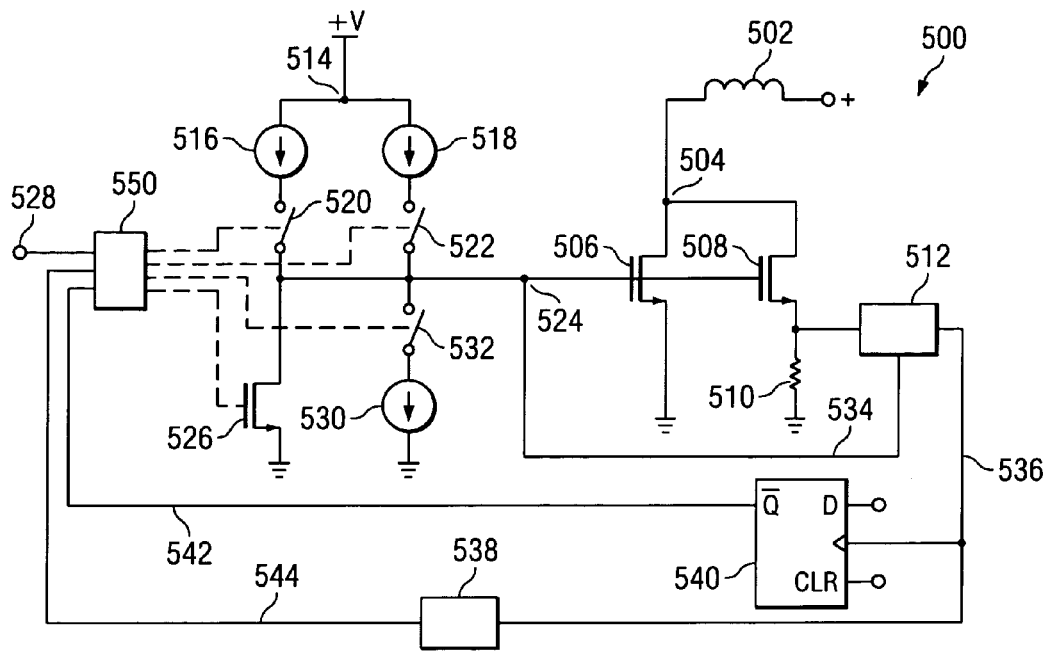
FIG. 5 is a schematic block diagram of a second embodiment of the present invention.

FIG. 5 shows a modification of the circuit shown in FIG. 1 generally as 500. Those elements of FIG. 5 that correspond to elements in FIG. 1 have similar reference numerals. In FIG. 5, a latch circuit has been added in the form of D-type flip-flop 540. Flip-flop 540 has its clock input coupled to line 536 receiving the output from overcurrent detector circuit 512. The D and clear inputs to flip-flop 540 are each coupled to the signals to turn on FET switching transistor 506. The Q bar output of flip-flop 540 on line 542 is coupled to control switches 520 and 522 to disconnect current sources 516 and 518, respectively.

Figure 6:
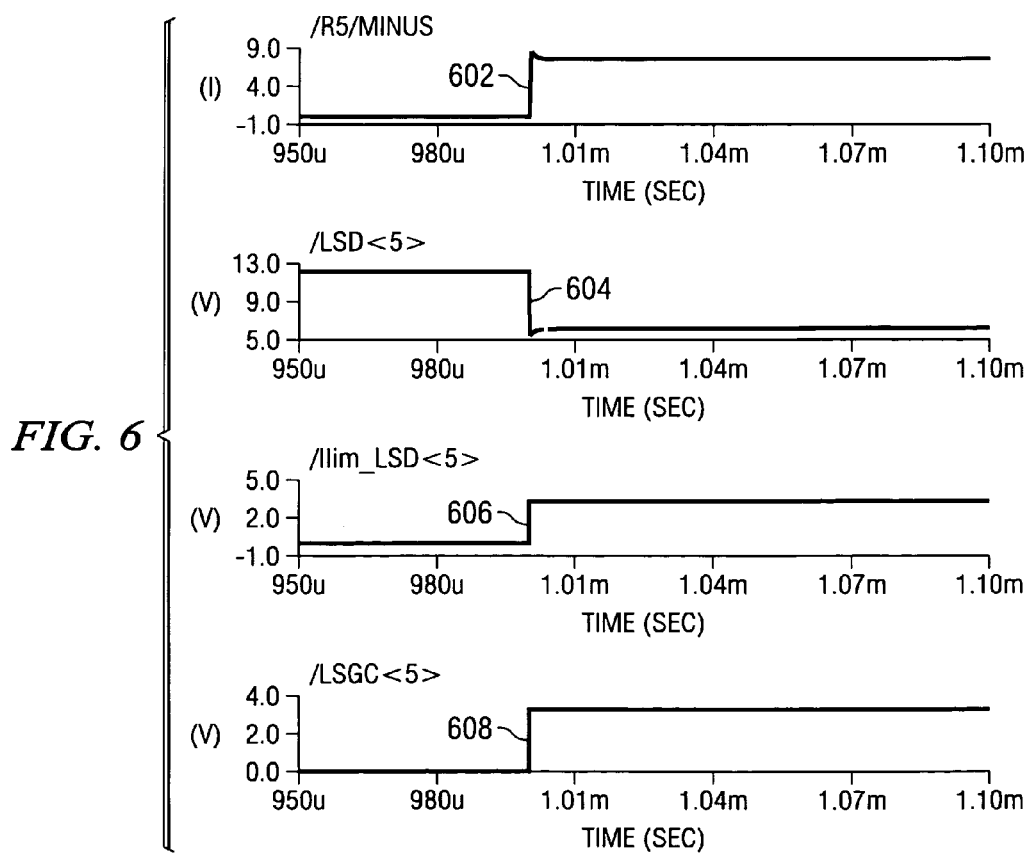
FIG. 6 is a simulation of the circuit shown in FIG. 5 without cable inductance being modeled.
Figure 7:
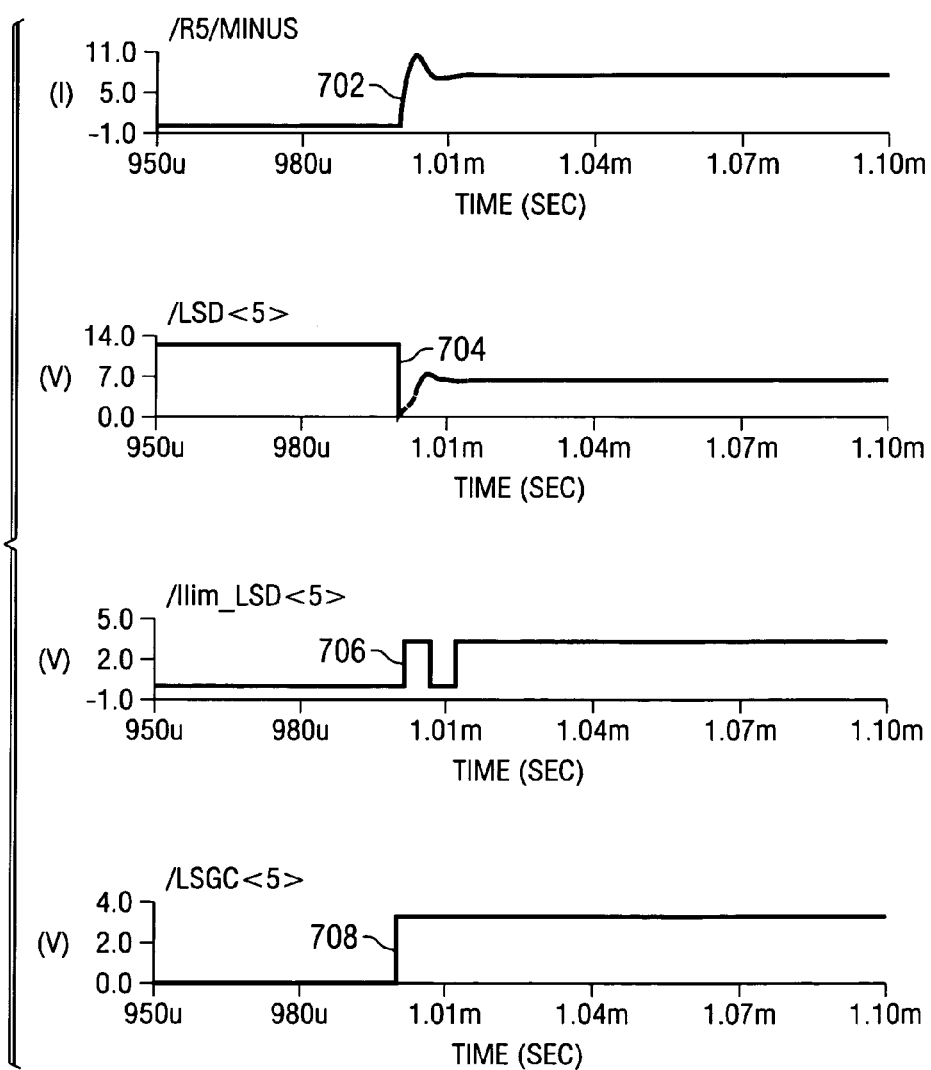
FIG. 7 is a simulation of the circuit shown in FIG. 5 in which cable inductance has been modeled.

Operation of the circuit in FIG. 5 is shown in a computer simulation in FIG. 6, in which the inductance of the cable has been neglected. As can be seen, FIG. 6 corresponds to FIG. 2 and utilizes similar reference numerals, showing that the circuit continues to operate properly. FIG. 7 is a computer simulation of the circuit shown in FIG. 5, in which the inductance of the battery cable has been taken into account and a value of 1.5 µH per meter utilized. The reference numerals in FIG. 7 are similar to those of FIGS. 2 and 6. When the turn on command signal 708 for the FET switching transistor 506 goes high, we see that the output voltage across the transistor drops to approximately zero and the current rises showing the current for the solenoid coil 502. As can be seen by signal 706, the current limit circuit is triggered on and then triggered off as the current goes below the threshold for current limit circuit 512. However, after the LRC ringing settles, there are no additional spikes, so that the timer circuit 538 can be activated and transistor 506 turned off. Note that the timer circuit 538 in FIG. 5 was not included in this simulation. However, it is shown that signal 706 remains in a logic high state for an extended period of time, unlike signal 406 from FIG. 4 in which the logic signal reset periodically. The stable logic high state of signal 706 allows for a timer circuit 538 to respond appropriately to that signal. Using the timer circuit with this signal avoids overheating damage to the integrated circuit.

While the invention has been shown and described with reference to preferred embodiments thereof, it is well understood by those skilled in the art that various changes and modifications can be made in the invention without departing from the spirit and scope of the invention as defined by the appended claims.

The invention claimed is:

1. An FET switch having a current limit circuit comprising:
   an FET switching transistor;
   a current detector coupled to the FET switching transistor for measuring the current through the FET switching transistor;
   a first biasing circuit coupled to a gate of the FET switching transistor providing a first biasing current to the gate;
   a second biasing current coupled to the gate of the FET switching transistor providing a second biasing current to the gate, the second biasing current being less than the first biasing current; and
   a biasing switching circuit coupled to the first biasing circuit to disconnect the flow of the first biasing current when an overcurrent condition is detected by the current detector, whereby the current detector can limit the FET switching transistor current.

2. The FET switch of claim 1 wherein the current detector includes a pass transistor in parallel to the FET switching transistor, the pass transistor conducting a portion of load current.

3. The FET switch of claim 1 wherein the FET switch is coupled to an inductive load.

4. The FET switch of claim 3 wherein the inductive load is a solenoid in an ABS brake system.

5. The FET switch of claim 1 wherein turn on and turn off times for the FET switching transistor are each less than substantially 250 ns.

6. The FET switch of claim 4 wherein turn on and turn off times for the FET switching transistor are each less than substantially 250 ns.

7. The FET switch of claim 5 wherein the current detector comprises a deglitch circuit for preventing the current detector from exiting current limit mode due to changes in the FET switching transistor current as the result of ringing.

8. The FET switch of claim 6 wherein the current detector comprises a deglitch circuit for preventing the current detector from exiting current limit mode due to changes in the FET switching transistor current as the result of ringing.

9. The FET switch of claim 1 wherein the first bias current is substantially 20 ma. and the second bias current is substantially 40 microamps.

10. The FET switch of claim 6 wherein the first bias current is substantially 20 ma. And the second bias current is substantially 40 microamps.

11. In an ABS braking system, an FET switch for PWM the voltage across a control solenoid comprising:
   an FET switching transistor having a conductive path coupled to the solenoid at a node;
   a current detector coupled to a FET switching transistor for measuring a current therethrough, the current detector generating a current control signal in response to current through the FET switching transistor which exceeds a predetermined level;
   a first biasing current source coupled to the gate, the first biasing current source enabling the FET switching transistor to be turned on fast enough to generate a ringing at the node caused by the inductance of connecting cable which ringing causes the current detector to terminate the current control signal;
   a second biasing current source coupled to the gate, the second current source providing a biasing current;
   a biasing current switching circuit coupled to the first biasing circuit to disconnect flow of the first biasing current in response to the current control signal; and
   a deglitching circuit coupled to the current detector to prevent the current detector from terminating the current control signal as the result of the ringing.

12. The FET switch of claim 11 wherein the current detector includes a pass transistor in parallel to the FET switching transistor, the pass transistor conducting a portion of load current.

13. The FET switch of claim 11 wherein turn on and turn off times for the FET switching transistor are each less than substantially 250 ns.

14. The FET switch of claim 11 further comprising a timer circuit for turning off the FET switching transistor if it remains in the current control mode for a predetermined period of time.

15. The FET switch of claim 13 further comprising a timer circuit for turning off the FET switching transistor if it remains in the current control mode for a predetermined period of time.

16. The FET switch of claim 14 wherein the deglitching circuit comprises a flip-flop circuit toggled between two states by the current control signal.

17. The FET switch of claim 16 wherein current through the FET switching transistor is regulated to a predetermined maximum by the current detector.

18. The FET switch of claim 11 wherein the first bias current is substantially 20 ma. and the second bias current is substantially 40 microamps.

19. A current limit circuit comprising:
   a current detector coupled to a FET switching transistor for measuring current therethrough for generating a current control signal;
   a first switchable current source coupled to the gate providing a first biasing current and responsive to the current control signal from the current detector;
   a second current source coupled to the gate providing a second biasing current less than the first biasing current, whereby the detection of an overcurrent condition by the current detector disconnects the first biasing current to allow the current flowing through the current detector to reduce the drive on the FET switching transistor to limit the current therethrough.

20. The current limit circuit of claim 19 wherein the FET switching transistor is a power FET switching transistor and the load is a solenoid in the ABS braking system, the FET switching transistor being switched at a speed at which inductance in cable in the braking system causes ringing of the current through the FET switching transistor to disable current control; and further comprising a deglitch circuit to disable the current detector from exiting a current control mode.

* * * * *